United States Patent
Pfaffinger et al.

(10) Patent No.: US 12,495,533 B2
(45) Date of Patent: Dec. 9, 2025

(54) METHOD AND DEVICE FOR POPULATING CIRCUIT BOARDS BY FIXEDLY ASSIGNED COMPONENTS ON AT LEAST TWO ASSEMBLY LINES

(71) Applicant: Siemens Aktiengesellschaft, Munich (DE)

(72) Inventors: Alexander Pfaffinger, Munich (DE); Christian Royer, Ottobrunn (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 449 days.

(21) Appl. No.: 18/015,353

(22) PCT Filed: Jul. 28, 2020

(86) PCT No.: PCT/EP2020/071262
§ 371 (c)(1),
(2) Date: Jan. 10, 2023

(87) PCT Pub. No.: WO2022/022811
PCT Pub. Date: Feb. 3, 2022

(65) Prior Publication Data
US 2023/0345689 A1    Oct. 26, 2023

(51) Int. Cl.
*H05K 13/08* (2006.01)
*G06Q 10/0631* (2023.01)
*G06Q 50/04* (2012.01)

(52) U.S. Cl.
CPC ..... *H05K 13/085* (2018.08); *G06Q 10/06315* (2013.01); *G06Q 50/04* (2013.01); *Y10T 29/49155* (2015.01)

(58) Field of Classification Search
CPC .... H05K 13/085; H05K 13/04; H05K 3/3421; H05K 13/0408; Y10T 29/49155
(Continued)

(56) References Cited

U.S. PATENT DOCUMENTS 11,157,840 B2 * 10/2021 Pfaffinger ............ G06Q 10/043
2006/0036869 A1 * 2/2006 Faught ................ G06F 21/6218
713/182
(Continued)

FOREIGN PATENT DOCUMENTS

CN    101578931 A    11/2009
CN    104412733 A    3/2015
(Continued)

OTHER PUBLICATIONS

Huang Zhenlin et al: "Research and Implementation of Intelligent Manufacturing Digital Workshop Based on Programmable Logic Controller", Automation Panorama, vol. 8, p. 46-51, Aug. 25, 2017.
(Continued)

*Primary Examiner* — Thiem D Phan
(74) *Attorney, Agent, or Firm* — Schmeiser, Olsen & Watts LLP (57) ABSTRACT

A method for populating circuit boards with a quantity of required component types on at least two assembly lines is provided, wherein fixedly assigned components can be mounted on each assembly line, wherein the method includes the following steps: a) acquiring circuit board types; b) acquiring component types; c) acquiring fixedly assigned component clusters for each assembly line; d) acquiring circuit board types that can be assigned to a fixedly assigned component cluster for each assembly line; e) acquiring circuit board types that can be assigned to a cluster extension for each fixedly assigned component cluster; f) determining an assignment of circuit board types to fixedly assigned component clusters and cluster extensions; and g) optimising the determined assignment until an assignment quality exceeds a predeterminable level.

5 Claims, 2 Drawing Sheets

(58) Field of Classification Search
USPC .................................. 29/846, 739, 829, 832
See application file for complete search history.

(56) References Cited

U.S. PATENT DOCUMENTS

| | | |
|---|---|---|
| 2015/0160648 A1 | 6/2015 | Craiovan et al. |
| 2015/0195966 A1 | 7/2015 | Pfaffinger et al. |
| 2018/0007794 A1 | 1/2018 | Pfaffinger et al. |
| 2018/0324991 A1 | 11/2018 | Pfaffinger et al. |
| 2020/0120839 A1 | 4/2020 | Pfaffinger et al. |
| 2021/0136968 A1 | 5/2021 | Pfaffinger et al. |

FOREIGN PATENT DOCUMENTS

| | | |
|---|---|---|
| CN | 107006149 A | 8/2017 |
| CN | 107251676 A | 10/2017 |
| CN | 110214477 A | 9/2019 |
| CN | 110495264 A | 11/2019 |
| EP | 0478361 A1 | 4/1992 |
| WO | 2014079600 A1 | 5/2014 |
| WO | WO 2018177538 A1 | 10/2018 |

OTHER PUBLICATIONS

International Search Report for PCT /EP2020/071262 dated Apr. 23, 2021.

* cited by examiner

FIG 1

METHOD AND DEVICE FOR POPULATING CIRCUIT BOARDS BY FIXEDLY ASSIGNED COMPONENTS ON AT LEAST TWO ASSEMBLY LINES

CROSS-REFERENCE TO RELATED APPLICATIONS

This application claims priority to PCT Application No. PCT/EP2020/071262, having a filing date of Jul. 28, 2020, the entire contents of which are hereby incorporated by reference.

FIELD OF TECHNOLOGY

The following relates to a method and device for populating circuit boards by a component setup on at least two assembly lines in a manufacturing facility.

BACKGROUND

An assembly line in a manufacturing or production facility, which typically comprises multiple assembly lines, is configured to populate one or more circuit boards with a number of components.

In many factories or manufacturing facilities in the field of electronics production, circuit boards (or assemblies) to be manufactured have gradually become assigned to the SMT assembly lines of the respective factories. Because of technical restrictions, not every circuit board can be manufactured or populated on every assembly line. The circuit boards usually also have different production times on the assembly lines. Moreover, the maximum production time capacities of the assembly lines cannot be exceeded.

A distinction may be made here between variant component manufacturing and fixedly assigned component manufacturing.

In variant component manufacturing, the circuit boards to be manufactured or populated are divided into component clusters ("clusters") for a short planning horizon (approximately 1-5 days). A component cluster is a set of circuit board types which is producible using a predetermined number of component types on the assembly line. The set of the component types required for this purpose is called the component setup and is typically accommodated in a set of shuttle tables. A shuttle table is typically equipped with the matching components of the component types in the preliminary setup for production and stripped again thereafter. Multiple such shuttle tables form a shuttle table set.

In fixedly assigned component manufacturing, the component setups for the circuit boards to be manufactured are fixedly equipped on shuttle tables for a longer term (approximately 6-12 months). In the case of multiple fixed component setups per assembly line, the shuttle tables are exchanged accordingly upon the component cluster change. The equipping and stripping of shuttle tables is then no longer necessary in the daily production.

The productions are often also operated in mixed form, wherein a part of the circuit boards are produced in fixedly assigned component manufacturing and another part are produced in variant component manufacturing on the same assembly line. Due to the lower expenditure for planning, stock keeping, preliminary setup, and refitting, in general attempts are made to increase the portion of the fixedly assigned component manufacturing and reduce the portion of the variant component manufacturing.

The goals in production planning are, for example:
(a) The component expenditure on the assembly lines is to be as low as possible. Therefore, as many circuit boards as possible are to be able to be manufactured using fixed component setups.
(b) The number of component clusters on the assembly lines is to be as low as possible to reduce the refitting time expenditure.
(c) The total production time is to be as minimal as possible.

However, there is still another goal which is very important in practice:

Since the planning horizon is rather medium-term in the present case, there are uncertainties with respect to the future piece counts of the circuit board types. This can result in real utilization/production times of the assembly lines deviating undesirably strongly from the production plan. In particular, some assembly lines can stand "empty" due to underutilization, while other assembly lines are overloaded and cannot process their production orders in a timely manner.

If multiple similar assembly lines are present, which are each operated with fixed component setups, it is possible to exchange the fixed component setups between the assembly lines.

SUMMARY

An aspect relates to a method and a device even more flexible than the above-mentioned conventional art, in particular in the industrial environment, so that the most uniform possible utilization of the assembly lines can be achieved, in particular if one of the assembly lines is possibly to fail entirely or partially.

Embodiments of the invention claim a method for populating circuit boards by a component setup on at least two assembly lines in a manufacturing facility,
  wherein the component setup comprises a number of component types, which is sufficient for populating a number of circuit board types assigned to the component setup, which form a component cluster of circuit board types,
  wherein one fixed component setup can be attached during a predeterminable chronological planning horizon for each assembly line,
  wherein a fixed component setup which is fixedly set up on shuttle tables of a shuttle table set and comprises reserves of components of the component types in lines remains unchanged during the planning horizon and can be used repeatedly on the assembly line; wherein the method comprises the following steps:
  a) acquiring a set of circuit board types which are to be populated within the planning horizon in the manufacturing facility;
  b) acquiring a set of component types of all circuit board types to be populated within the planning horizon with their space requirement on lines of the shuttle table set;
  c) acquiring a set of fixed component setup component clusters per assembly line;
  d) acquiring circuit board types assignable to a fixed component setup component cluster per assembly line, the circuit boards of which are to be populated on the assembly line,
  e) acquiring circuit board types assignable to a component cluster expansion per fixed component setup component cluster, the circuit boards of which are to be populated on the assembly line, wherein a component cluster expansion results from a component cluster minus the fixed component setup component cluster, f) determining an assignment of circuit board types to fixed component setup component clusters and component cluster expansions, wherein the assignment takes place in such a way that a space requirement on lines of the component types assigned to a fixed component setup component cluster and those assigned to a component cluster expansion is less than or equal to the number of lines which have space in the component setup; and wherein the sum of the production times of the circuit boards to be populated within the planning horizon of those circuit board types which are assigned to the fixed component setup component cluster falls below a predeterminable limiting value, g) optimizing the determined assignment until an assignment quality exceeds a predeterminable measure;

and wherein an advantageous set of additional circuit boards are to be populated on each assembly line, the population of which is planned outside the fixed component setup component cluster and inside the component cluster expansion, and h) setting up the lines with the components, the component types of which are used for populating the circuit boards in the respective fixed component setup component clusters and component cluster expansion.

The populating of the circuit boards on the assembly line is carried out by the component setup from h).

The assignment quality can be determined on the basis of one of the following possibilities:

a) a number of orders during the planning horizon, wherein each order relates to populating a number of circuit boards of a predetermined circuit board type of the fixed component setup component cluster and/or b) the sum of the circuit boards to be populated within the planning horizon of those circuit board types which are assigned to the fixed component setup component cluster;

c) the sum of the production times of the circuit boards to be populated within the planning horizon of those circuit board types which are assigned to the fixed component setup component cluster.

Therefore, circuit boards of circuit board types can also be manufactured or populated on this assembly line, which are actually supposed to be manufactured on another assembly line. In the event of failure or overload of the other assembly line, a type of redundancy can thus be provided. Therefore, at least a part of the production from the one or multiple other assembly lines can be taken over using this assembly line.

The advantageous set of additional circuit boards can be determined or computed as follows:

from a maximum number of additional circuit boards which can be populated on these assembly lines, and/or from a maximum number of circuit board types, if the additional circuit boards are populated on this assembly line, and/or from a maximum number of high-priority circuit board types, and/or from a frequency of the occurrence of one circuit board type within the circuit boards that can be additionally populated, and/or from a maximum achievable piece count per unit of time of circuit boards that can be populated in the manufacturing facility, and/or from a selection of circuit board types having maximum total production time which are selected from the set of circuit board types acquired under a).

The setup of component types on the free lines can thus be optimized under the given specifications.

The determination of the assignment from f) and the optimization of the determined assignment from g) can be carried out by mixed integer linear programming. Significantly better solutions may be achieved by the use of exact mathematical optimization methods than using heuristics possible in practice. For small IP programs (integer linear programs) standard solvers are usable, e.g., CPLEX, SCIP, Gurobi.

A further aspect of embodiments of the invention is a device in the form of a control device, which is designed for the control of carrying out the populating of circuit boards by a component setup on each assembly line in a manufacturing facility.

The control device is suitable for populating circuit boards by a component setup on at least two assembly lines in a manufacturing facility, wherein the component setup comprises a number of component types, which is sufficient for equipping a number of circuit board types assignable by the component setup, which form a component cluster of circuit board types, wherein one fixed component setup can be attached during a predeterminable chronological planning horizon for each assembly line, wherein a fixed component setup which is fixedly set up on shuttle tables of a shuttle table set and comprises reserves of components of the component types in lines remains unchanged during the planning horizon and can be used repeatedly on the assembly line;

wherein the control device is designed to:

a) acquire a set of circuit board types which are to be populated within the planning horizon in the manufacturing facility;

b) acquire a set of component types of all circuit board types to be populated within the planning horizon with their space requirement on lines of the shuttle table set;

c) acquire a set of fixed component setup component clusters per assembly line;

d) acquire circuit board types assignable to a fixed component setup component cluster per assembly line, the circuit boards of which are to be populated on the assembly line, e) acquire circuit board types assignable to a component cluster expansion per assembly line, the circuit boards of which are to be populated on the assembly line, wherein a component cluster expansion results from a component cluster minus the fixed component setup component cluster, f) determine an assignment of circuit board types to fixed component setup component clusters and component cluster expansions, wherein the assignment takes place in such a way that a space requirement on lines of the component types assigned to a fixed component setup component cluster and those assigned to a component cluster expansion is less than or equal to the number of lines which have space in the component setup; and wherein the sum of the production times of the circuit boards to be populated within the planning horizon of those circuit board types which are assigned to the fixed component setup component cluster falls below a predeterminable limiting value, g) optimize the determined assignment until an assignment quality exceeds a predeterminable measure;

and wherein an advantageous set of additional circuit boards are to be populated on each assembly line, the populating of which is planned outside the fixed component setup component cluster and inside the component cluster expansion, and h) control the setting up of the lines with the components, the component types of which are used for populating the circuit boards in the respective fixed component setup component clusters and component cluster expansion.

The device and computer program (products) can be designed or refined according to the above-described method or the refinements/embodiments of the present method.

Furthermore, a computer program (product) is provided comprising program code which can be executed by at least one processor and which causes the at least one processor to carry out the method according to embodiments of the invention. The computer program can run on a computer, e.g., in the cloud, server, and/or PC or can be stored as a computer program product (non-transitory computer readable storage medium having instructions, which when executed by a processor, perform actions) on a computer-readable medium. The computer program runs the runtime environment in this case.

In addition, a variant of the computer program (product) can be provided having program commands for configuring a generation device, for example a 3D printer, a computer system, or a production machine capable of generating processors and/or devices.

The means can be hardware, firmware, and/or software units or modules.

If not indicated otherwise in the following description, the terms "carry out", "calculate", "computer-based", "compute", "establish", "generate", "configure", "reconstruct", and the like relate to actions and/or processes and/or processing steps which change and/or generate data and/or convert the data into other data, wherein the data are represented or can be provided in particular as physical variables, for example as electrical pulses. In particular, the expression "computer" is to be interpreted as broadly as possible, in particular to cover all electronic devices having data processing properties. Computers can thus be, for example, personal computers, servers, programmable logic controllers (PLC), handheld computer systems, Pocket PC devices, mobile radio devices, and other communication devices which can process data in a computer-based manner, processors, and other electronic devices for data processing.

"Computer-based" can be understood in conjunction with embodiments of the invention, for example, as an implementation of the method in which in particular a processor executes at least one method step of the method.

Provide can be understood to mean that the application and/or capability packages thereof is provided to the above-mentioned means, for example, in the form of a processing unit or CPU or a control unit. Provide can also be understood to mean that the processing unit is provided with an operation, wherein the operation can be the provided application itself and/or uses the capability packages for controlling and/or executing the configuration.

BRIEF DESCRIPTION

Some of the embodiments will be described in detail, with reference to the following figures, wherein like designations denote like members, wherein.

DETAILED DESCRIPTION

Figure 1:
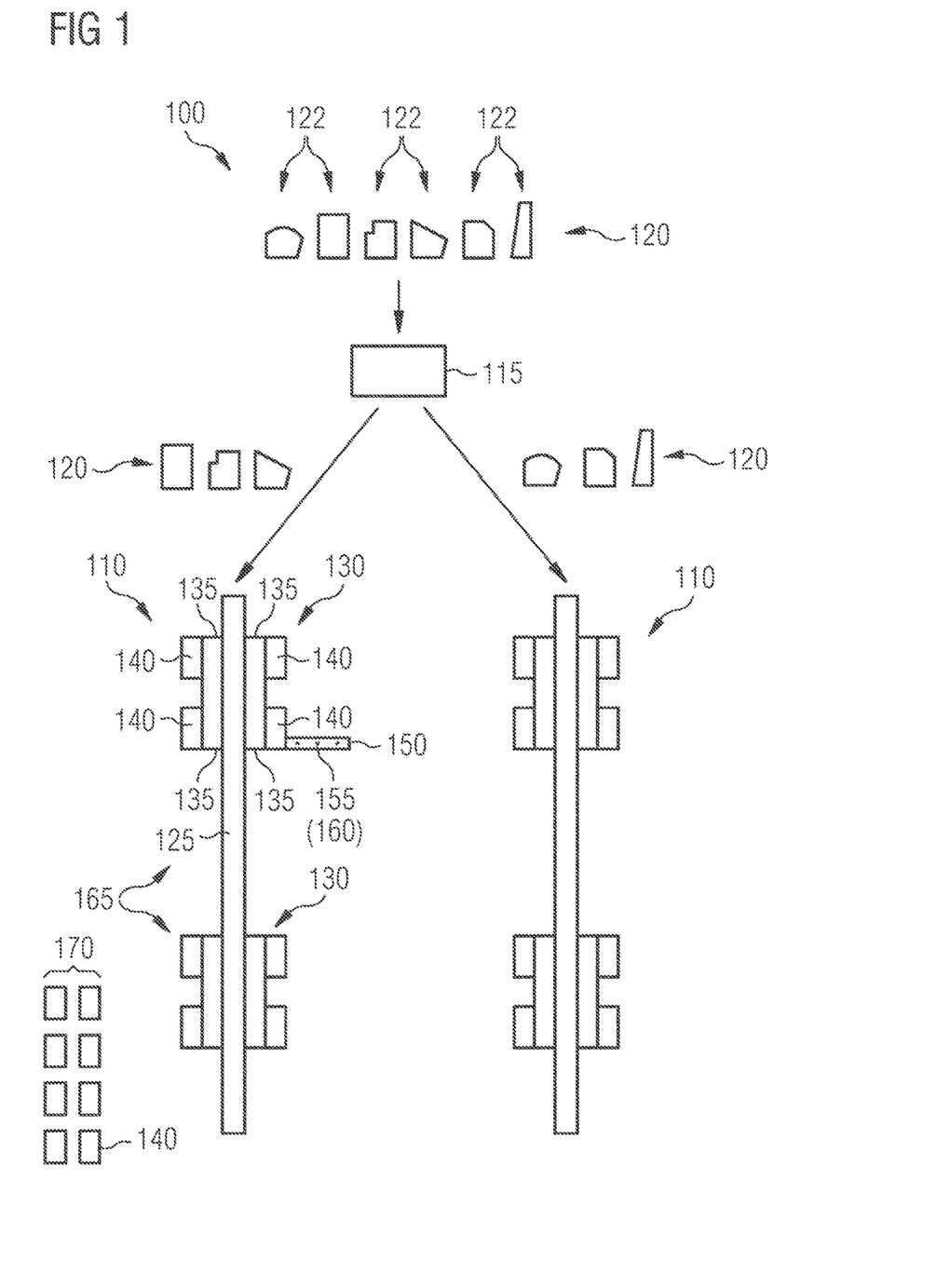
FIG. 1 shows an assembly system which can be used in a manufacturing facility.

FIG. 1 shows a populating system 100. The populating system 100 comprises one or more assembly lines 110 and a control device 115. Each assembly line 110 comprises an optional transport system 125 and one or more populating machines 130. Each populating machine 130 comprises one or more populating heads 135, which are each configured to pick up components 155 from a shuttle table 140 and position them at a predetermined position on the circuit board 120, which is located on the transport system 125.

During the populating process, the circuit board 120 is typically stationary with respect to the populating machine 130. The shuttle tables 140 each comprise a plurality of feed devices 150, of which only one is shown as an example in FIG. 1. Each feed device 150 keeps ready a reserve of components 155 of a predetermined component type 160. The feed device 150 has a capacity for the components 155, which is typically expressed in lines. A line is typically 8 mm wide and the number of lines of each feed device 150 is restricted, for example to 40. Components 155 of the same component type 160 are typically provided in a belt, on a tray, or in a tube. Each component type 160 requires a predetermined number of lines, which typically adjoin one another, on the feed device 150.

Each feed device 150 can be configured to keep ready different components 155 and typically different feed devices 150 can be attached to a shuttle table 140. If a component 155 of a component type 160 is required at the populating machine 130, which is not present in one of the shuttle tables 140, one of the attached shuttle tables 140 is typically not provided with the required components 155, but rather exchanged completely for another, appropriately set up shuttle table 140. Setting up a shuttle table 140 to be switched in with components 155 is called preliminary setup and can require a processing time in the range of hours.

Since a change of shuttle tables 140 on the assembly line 110 is typically linked to a production stoppage, efforts are made to carry out changes of the shuttle tables 140 as rarely as possible.

To populate a predetermined set of circuit boards 120, component setups can be formed which each comprise reserves of components 155 of predetermined component types 160, wherein each of the circuit boards 120 of the set can be completely populated with components 155 of the component setup. A component setup can be implemented by a number of shuttle tables 140. A fixed component setup 165, the shuttle tables 140 of which are attached to the assembly line 110, and a variant component setup 170, the shuttle tables 140 of which are separated from the assembly line 110, are formed in the illustration of FIG. 1. One or more fixed component setups 165 and one or more variant component setups 170 can be provided. A desired case without variant component setups 170 is possible.

The fixed component setup 165 is configured to remain unchanged with respect to its component types 160 at least during a chronological planning horizon, which can be half a year or a year, for example. Components 155 can thus be refilled at the shuttle tables 140 of the fixed component setup 165 if needed, but the assignment of component types 160 to lines of the shuttle tables 140 remains unchanged. If multiple fixed component setups 165 are provided, these can be exchanged with one another or with one of the variant component setups 170 within the planning horizon.

In the example, only fixed component setups are used on the assembly line 110 described in more detail.

The control device 115 assigns circuit board types 122, the assigned circuit boards 120 of which are to be populated on the assembly line 110, to a component cluster. A component cluster is a set of circuit board types 122, the circuit boards 120 of which can be completely populated using components 155, which are provided in the assigned component setup 165, 170. A component cluster is typically assigned to precisely one component setup 165, 170 and vice versa.

Assembly lines which are only operated using fixed component setups are particularly strongly in danger of underutilization with a fixed circuit board-line assignment. In the event of overload, circuit boards can possibly be handed over to assembly lines, on which manufacturing is also carried out using variant component setups.

In the case of multiple identical assembly lines, which are each operated using multiple fixed component setups, one has the flexibility of exchanging the fixed component setups within the assembly lines.

To increase the manufacturing flexibility in the case of different assembly lines, which are operated using fixed component setups or in the case of assembly lines which are each operated using one fixed component setup, it is therefore advantageous if still further circuit board types assigned to other assembly lines can be manufactured using the fixed component setup/the fixed component setups of an assembly line. This is particularly advantageous if an assembly line entirely or partially fails. At least a part of the circuit board types of the failed assembly line can thus be assigned if necessary to assembly lines having fixed component setup and the circuit boards thereof can be populated there. However, this only functions if lines for accommodating components are still free on the fixed component setup assembly line and these components correspond to the component types which are used on the other assembly line.

Figure 2:
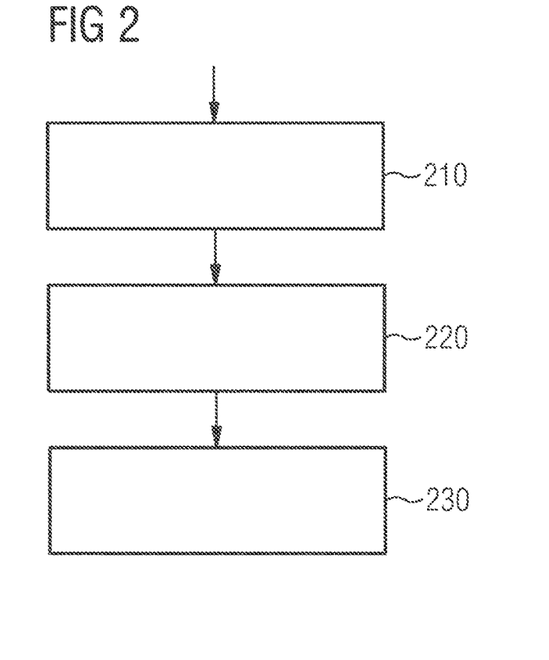
FIG. 2 schematically shows a flow chart.

FIG. 2 shows a flow chart. In step 210, first a set of circuit board types which are to be populated within a planning horizon in the manufacturing facility is acquired, then in step 220, fixed component setups are acquired or formed and circuit board types assignable to a component cluster expansion per fixed component setup component cluster are acquired, the circuit boards of which are to be populated on the assembly line, wherein a component cluster expansion results from a component cluster minus the fixed component setup component cluster.

In step 230, a circuit board type-assembly line assignment takes place, wherein the assignment takes place in such a way that a space requirement for lines of the component types assigned to a fixed component setup component cluster and the component types assigned to a component cluster expansion is less than or equal to the number of lines which have space in the setup.

This approach can be based on mixed integer linear optimization.

To form fixed component setups with fixed portions and component cluster expansion portions or flexible portions, the following procedure is used:

step 210:
    a) acquiring a set of circuit board types which are to be populated within the planning horizon in the manufacturing facility;
    b) acquiring a set of component types of all circuit board types to be populated within the planning horizon with their space requirement on lines of the shuttle table set;

step 220:
    acquiring the fixed component setups per assembly line. In other words:
    c) acquiring a set of fixed component setup component clusters per assembly line;
    d) acquiring circuit board types assignable to a fixed component setup component cluster per assembly line, the circuit boards of which are to be populated on the assembly line,
    e) acquiring circuit board types assignable to a component cluster expansion per fixed component setup component cluster, the circuit boards of which are to be populated on the assembly line, wherein a component cluster expansion results from a component cluster minus the fixed component setup component cluster, and in step 230:
    f) determining an assignment of circuit board types to fixed component setup component clusters and component cluster expansions,
    wherein the assignment takes place in such a way that a space requirement on lines of the component types (160) assigned to a fixed component setup component cluster and those assigned to a component cluster expansion is less than or equal to the number of lines which have space in the component setup (165); and
    wherein the sum of the production times of the circuit boards (120) to be populated within the planning horizon of those circuit board types (122) which are assigned to the fixed component setup component cluster falls below a predeterminable limiting value,
    g) optimizing the determined assignment until an assignment quality exceeds a predeterminable measure;
    and wherein an advantageous set of additional circuit boards are to be populated on each assembly line, the population of which is planned outside the fixed component setup component cluster and inside the component cluster expansion.

The setting up of the lines with the components can thus be carried out, the component types of which are used for populating the circuit boards in the respective fixed component setup component clusters and component cluster expansion.

For each assembly line having fixed component setups, it is ascertained whether and how these fixed component setups may be expanded so that circuit boards may also be manufactured using them, the manufacturing of which is assigned to other assembly lines.

Fixed component setups having flexible portions are thus formed. A flexible portion of a fixed component setup is understood to mean circuit boards which are actually assigned to other assembly lines but can be manufactured using the fixed component setup. This approach is generally only practical for a few fixed component setups, but is not restricted thereto. This approach is based on mixed integer linear optimization.

This optimization task is achieved by the following MILP (mixed integer linear programming), with the goal of making the entirety of the flexible portions of the fixed component setups of an assembly line/as optimal as possible or possibly to maximize them.

MILP relates to the optimization of linear target functions over a set which is restricted by linear equations and inequalities. It is the foundation of the solution methods of (mixed) integer linear optimization. A so-called solver is a collective designation for special mathematical computer programs which can numerically solve mathematical problems. In conjunction with MILP (mixed integer linear programming), standard solvers, e.g., CPLEX, Scip, Gurobi, Xpress can be used for IP programs (integer optimization models).

A mixed integer linear optimization model is first described hereinafter for the formation of two fixed component setups on different assembly lines. This may be expanded to more than two fixed component setups.

A set of circuit board types is divided onto the fixed component setups of two assembly lines (fixed portion). Moreover, a flexible portion of circuit board types of the other assembly line is also assigned to each assembly line, which can also be manufactured using the respective fixed component setup.

The following designations apply in the MIP formulation.

Indices
C set of the component types
R set of circuit boards
$R_c$ set of the circuit boards having component type c
Cl set of the fixed component setups/fixed component setup clusters Cl={fixed component setup line 1, fixed component setup line 2}

Parameters
$Width_c$ space requirement of a component type c in lines
$LineCap_{cl}$ number of the lines of the component types which have space in the setup of the component cluster cl
$TimeLimitr_{r,cl}$ production time limits for the fixed component setup cl
$Timer_{r,cl}$ production time of the circuit board r having the fixed component setup cl Binary Variables
$assign_{r,cl}$ variable which indicates whether a circuit board r (the fixed portion) is assigned to the component cluster cl. (In this case it assumes the value 1, otherwise the value 0)
$assignFlex_{r,cl}$ variable which indicates whether a circuit board r is assigned to the flexible portion of the component cluster cl. (In this case, it assumes the value 1, otherwise the value 0) $setup_{c,cl}$ variable which indicates whether the component type c has to be equipped in the setup of the component cluster cl. (In this case it assumes the value 1, otherwise the value 0)

Target Function
$\Sigma_{cl \in cl}\Sigma_{r \in R} assignFlex_{r,cl} Time_{r,cl}$
maximize Secondary Conditions:
(1) Each circuit board type has to be fixedly assigned to precisely one component cluster.

$$\sum_{cl \in Cl} assign_{r,cl} = 1 \quad r \in R$$

(2) The component types of the circuit boards of a component cluster have to match in a component setup.

$$\sum_{c \in C} Width_c \; setup_{c,cl} \leq LineCap_{cl} \quad cl \in Cl$$

(3) All component types of the fixed and flexible circuit board types of a component cluster have to be populated in the component setup of the component cluster $$\sum_{r \in R_c} assign_{r,cl} + assignFlex_{r,cl} \leq |R_c| setup_{c,cl} \quad c \in C, \, cl \in Cl$$

(4) The sum of the production times of the fixed circuit board types of a component cluster cannot exceed the production time limit.

$$\sum_{r \in R} assign_{r,cl} Time_{r,cl} \leq TimeLimit_{cl} \quad cl \in Cl$$

(5) A circuit board cannot be assigned simultaneously to the fixed and flexible portions of a component cluster.

$assign_{r,cl} + assignFlex_{r,cl} \leq 1 \quad cl \in cl$ (6) Variable restrictions $assign_{r,cl} \in \{0,1\} r \in R, cl \in cl$ $assignFlex_{r,cl} \in \{0,1\} r \in R, cl \in cl$ $setup_{c,cl} \in \{0,1\} r \in R, cl \in cl$ Moreover, the following points may be taken into consideration in the model by slightly changed and additional restrictions:

On the assembly line, there are component shuttle table restrictions, i.e., components cannot be on all shuttle tables, but only on a subset Maximum degree of filling of setups Expansion for multiple assembly lines having multiple fixed component setups Circuit board types can be assigned to at most one flexible fixed component setup portion.

The above-mentioned control device can then control the populating of the circuit boards on the assembly line using this flexible portion or the optimum setup.

Although embodiments of the invention were illustrated and described in more detail, embodiments of the invention are not thus restricted by the disclosed examples and other variations can be derived therefrom by a person skilled in the conventional art, without leaving the scope of protection of embodiments of the invention.

The implementation of the above method can take place on the basis of instructions which are provided on computer-readable memory media or in volatile computer memories (referred to in summary hereinafter as computer-readable memories). The computer memory can be associated with one or the above-mentioned control device. Computer-readable memories are, for example, volatile memories such as caches, buffers, or RAM and nonvolatile memories such as removable media, hard drives, etc.

The above-described functions or method steps can be provided here in the form of at least one instruction set in/on a computer-readable memory. The functions or steps are not linked to a specific instruction set or to a specific form of instruction sets or to a specific memory medium or to a specific processor or to specific execution schemes and can be executed by software, firmware, microcode, hardware, processors, integrated circuits, etc. operating alone or in any combination. Greatly varying processing strategies can be used, for example, serial processing by a single processor or multiprocessing or multitasking or parallel processing, etc.

The instructions can be stored in local or central memories, however, it is also possible to save the instructions on a remote system and to access them via a network.

The term "processor", "central signal processing", "control device", or "data evaluation means", as used here, comprises processing means in the broadest sense, thus, for example, servers, universal processors, graphics processors, digital signal processors, application-specific integrated circuits (ASICs), programmable logic circuits such as FPGAs, discrete analog or digital circuits and any combinations thereof, including all other processing means known to a person skilled in the art or developed in the future. Processors can consist here of one or more devices or units which can be integrated in a device. If a processor consists of multiple devices, these can be designed or configured for parallel or sequential processing or execution of instructions.

Although the present invention has been disclosed in the form of embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for populating a predetermined set of circuit boards by a component setup on at least two assembly lines in a manufacturing facility,
   wherein each assembly line comprises a transport system and one or more populating machines, wherein each populating machine comprises one or more populating heads, which are each configured to pick up components from a shuttle table,
   wherein the component setup comprises a number of component types, which is sufficient for populating a number of circuit board types assigned to the component setup, which form a component cluster of circuit board types,
   wherein a fixed component setup, which is fixedly set up on shuttle tables of a shuttle table set and comprises reserves of components of the component types in lines, remains unchanged during a planning horizon and can be used repeatedly on the assembly line;
   wherein the method comprises:
   a) acquiring a set of circuit board types which are to be populated within the planning horizon in the manufacturing facility;
   b) acquiring a set of component types of all circuit board types to be populated within the planning horizon with a space requirement on lines of the shuttle table set and acquiring a number of lines which have space in a component setup implemented by a number of shuttle tables according to the capacity of these shuttle tables;
   c) acquiring a set of fixed component setup component clusters per assembly line;
   d) acquiring circuit board types assignable to a fixed component setup component cluster per assembly line, the circuit boards of which are to be populated on the assembly line, wherein the circuit board types are each assigned to a fixed component setup on one of the assembly lines;
   e) acquiring circuit board types assignable to a component cluster expansion per fixed component setup component cluster, wherein a component cluster expansion together with an associated fixed component setup component cluster results in a component cluster, wherein a space requirement of lines of the component types assigned to a fixed component setup component cluster and those assigned to a component cluster expansion is less than or equal to the number of lines which have space in the component setup implemented by a number of shuttle tables according to the capacity of these shuttle tables, and wherein the circuit board types assignable to a component cluster expansion associated with a fixed component setup component cluster are circuit board types which have been assigned to a different assembly line than the circuit board types of the fixed component setup component cluster,
   f) determining an assignment of circuit board types to fixed component setup component clusters and component cluster expansions,
   wherein the assignment takes place in such a way that a space requirement on lines of the component types assigned to a fixed component setup component cluster and those assigned to a component cluster expansion is less than or equal to the number of lines which have space in the component setup implemented by a number of shuttle tables according to the capacity of these shuttle tables; and
   wherein the assignment takes place in such a way that a sum of the production times of the circuit boards to be populated within the planning horizon of those circuit board types which are assigned to the fixed component setup component cluster falls below a predeterminable production time limit,
   g) optimizing the determined assignment so that a sum of the production times of an advantageous set of additional circuit board types on each assembly line is maximized;
   and wherein the advantageous set of additional circuit board types is planned on each assembly line using the component cluster expansion,
   h) setting up the lines with the components, the component types of which are used for populating the circuit boards in the respective fixed component setup component clusters and component cluster expansion; and
   i) populating the circuit boards of the acquired circuit board types from a) on the assembly line by the component setup from h).

2. The method as claimed in the claim 1,
   wherein
   the assignment is additionally determined on a basis of one of the following possibilities:
   a) a number of orders during the planning horizon, wherein each order relates to populating a number of circuit boards of a predetermined circuit board type of the fixed component setup component cluster and/or
   b) a sum of the circuit boards to be populated within the planning horizon of those circuit board types which are assigned to the fixed component setup component cluster.

3. The method as claimed in claim 1,
   wherein the advantageous set of additional circuit boards results from the following:
   a maximum number of additional circuit boards which can be populated on the assembly lines, and/or
   a maximum number of circuit board types, if the additional circuit boards are populated on the assembly line, and/or
   a maximum number of high-priority circuit board types, and/or a frequency of an occurrence of one circuit board type within the circuit boards that can be additionally populated, and/or a maximum achievable piece count per unit of time of circuit boards that can be populated in the manufacturing facility, and/or a selection of circuit board types having maximum total production time which are selected from the set of circuit board types acquired under a).

4. The method as claimed in claim 1, wherein the determination of the assignment from f) and the optimization of the determined assignment from g) are carried out by mixed integer linear programming.

5. A control device suitable for populating a predetermined set of circuit boards by a component setup on at least two assembly lines in a manufacturing facility, wherein each assembly line comprises a transport system and one or more populating machines, wherein each populating machine comprises one or more populating heads, which are each configured to pick up components from a shuttle table, wherein the component setup comprises a number of component types, which is sufficient for populating a number of circuit board types assigned to the component setup, which form a component cluster of circuit board types, wherein a fixed component setup, which is fixedly set up on shuttle tables of a shuttle table set and comprises reserves of components of the component types in lines, remains unchanged during a planning horizon and can be used repeatedly on the assembly line;

wherein the control device is configured to a) acquire a set of circuit board types which are to be populated within the planning horizon in the manufacturing facility;

b) acquire a set of component types of all circuit board types to be populated within the planning horizon with a space requirement on lines of the shuttle table set and acquire a number of lines which have space in a component setup implemented by a number of shuttle tables according to the capacity of these shuttle tables;

c) acquire a set of fixed component setup component clusters per assembly line;

d) acquire circuit board types assignable to a fixed component setup component cluster per assembly line, the circuit boards of which are to be populated on the assembly line, wherein the circuit board types are each assigned to a fixed component setup on one of the assembly lines;

e) acquire circuit board types assignable to a component cluster expansion per assembly line, wherein a component cluster expansion together with an associated fixed component setup component cluster results in a component cluster, wherein a space requirement of lines of the component types assigned to a fixed component setup component cluster and those assigned to a component cluster expansion is less than or equal to the number of lines which have space in the component setup implemented by a number of shuttle tables according to the capacity of these shuttle tables, and wherein the circuit board types assignable to a component cluster expansion associated with a fixed component setup component cluster are circuit board types which have been assigned to a different assembly line than the circuit board types of the fixed component setup component cluster, f) determine an assignment of circuit board types to fixed component setup component clusters and component cluster expansions, wherein the assignment takes place in such a way that a space requirement on lines of the component types assigned to a fixed component setup component cluster and those assigned to a component cluster expansion is less than or equal to the number of lines which have space in the component setup implemented by a number of shuttle tables according to the capacity of these shuttle tables; and wherein the assignment takes place in such a way that a sum of the production times of the circuit boards to be populated within the planning horizon of those circuit board types which are assigned to the fixed component setup component cluster falls below a predeterminable production time limit, g) optimize the determined assignment so that a sum of the production times of an advantageous set of additional circuit board types on each assembly line is maximized;

and wherein the advantageous set of additional circuit boards is planned on each assembly line using the component cluster expansion, h) control the setting up of the lines with the components, the component types of which are used for populating the circuit boards in the respective fixed component setup component clusters and component cluster expansion; and i) carry out the population of the circuit boards of the acquired circuit board types from a) on the assembly line by the component setup from h).

* * * * *